United States Patent
De Brosse et al.

(10) Patent No.: US 7,505,348 B2
(45) Date of Patent: Mar. 17, 2009

(54) BALANCED AND BI-DIRECTIONAL BIT LINE PATHS FOR MEMORY ARRAYS WITH PROGRAMMABLE MEMORY CELLS

(75) Inventors: John K. De Brosse, Colchester, VT (US); Mark C. H. Lamorey, South Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 261 days.

(21) Appl. No.: 11/539,233

(22) Filed: Oct. 6, 2006

(65) Prior Publication Data

US 2008/0084734 A1  Apr. 10, 2008

(51) Int. Cl.
 *G11C 7/02* (2006.01)
(52) U.S. Cl. ............. 365/214; 365/163; 365/190; 365/230.06
(58) Field of Classification Search ............. 365/163 X, 365/189.01, 190 X, 214 O, 230.06 X, 163, 365/190, 214, 230.06
See application file for complete search history.

(56) References Cited

U.S. PATENT DOCUMENTS

| | | | |
|---|---|---|---|
| 5,937,295 A | 8/1999 | Chen et al. | |
| 6,480,438 B1 | 11/2002 | Park | |
| 6,842,362 B2 * | 1/2005 | Fujita et al. | 365/158 |
| 6,885,602 B2 | 4/2005 | Cho et al. | |
| 6,943,395 B2 | 9/2005 | Oh et al. | |
| 6,944,065 B2 | 9/2005 | Tedrow et al. | |
| 6,961,277 B2 | 11/2005 | Moore et al. | |
| 6,967,865 B2 | 11/2005 | Lee | |
| 6,992,369 B2 | 1/2006 | Kostylev et al. | |
| 7,116,593 B2 * | 10/2006 | Hanzawa et al. | 365/203 |
| 2002/0131295 A1 | 9/2002 | Naji | |
| 2003/0067013 A1 | 4/2003 | Ichihara et al. | |
| 2003/0206433 A1 | 11/2003 | Hush et al. | |
| 2004/0184331 A1 | 9/2004 | Hanzawa et al. | |
| 2005/0018493 A1 | 1/2005 | Casper et al. | |
| 2005/0068804 A1 | 3/2005 | Choi et al. | |
| 2005/0128799 A1 | 6/2005 | Kurotsuchi et al. | |
| 2006/0013038 A1 | 1/2006 | Kaiyang et al. | |
| 2006/0023532 A1 | 2/2006 | Hush et al. | |

* cited by examiner

*Primary Examiner*—VanThu Nguyen
(74) *Attorney, Agent, or Firm*—Gibb I.P. Law Firm, LLC; Michael LeStrange, Esq.

(57) ABSTRACT

An improved memory system incorporates an array of memory cells that are subjected to minimal location dependent power variations and, optionally, allows for bi-directional random access of millions of bits. The system architecture provides a consistent amount of bit line resistance in the write and read paths to each memory cell in the array, independent of position, in order to minimize variations in power delivery to the cells and, thereby, allow for optimal cell distributions. The system architecture further allows current to pass in either direction through the cells in order to minimize element electro-migration and, thereby, extend memory cell life.

16 Claims, 10 Drawing Sheets

BALANCED AND BI-DIRECTIONAL BIT LINE PATHS FOR MEMORY ARRAYS WITH PROGRAMMABLE MEMORY CELLS

BACKGROUND

1. Field of the Invention

The embodiments of the invention generally relate to memory arrays incorporating memory cells with programmable memory elements, and, more particularly, to such a memory array with balanced and, optionally, bi-directional bit line paths.

2. Description of the Related Art

Electrical impulses applied to phase change materials can "tune" or "program" them such that they exhibit a desired resistive property to store data. For example, the material can be programmed to store one binary state (e.g., "0") at a low resistance state and another binary state (e.g., "1") at a high resistance state. Additionally, such phase change materials can be programmed to multiple different resistance states (e.g., a high resistance completely amorphous state, multiple mid-resistance semi-amorphous/semi-crystalline states, and a low resistance completely crystalline state) in order to store more than just a single bit (0,1) of information.

The state of a phase change material can be switched through a heating and cooling process which is controlled electrically by passing current through the phase change element and the ohmic heating that occurs. To transform the cell from a high resistance amorphous state to a lower resistance state (i.e., to SET the material), a current pulse is sent through the programmable resistor, heating the phase change material above a predetermined temperature (i.e., above its crystallization temperature) for a given period of time to completely or partially crystallize the material. To transform the cell from a semi-amorphous/semi-crystalline or completely crystalline state to a completely amorphous state (i.e., to RESET the material), a high current pulse is applied to the cell, causing the phase change material to melt. During a subsequent quench cooling, the phase change material is amorphized.

Data that is stored in the programmable resistor can be read without destructing the programmed state of the phase change material. Specifically, a predetermined voltage that is less than the voltage required to achieve the crystallization temperature can be applied to a memory cell and, using a sense amplifier, the magnitude of the readout current through the cell can be detected and analyzed to determine the resistance state of the cell and, thereby, the binary state of the stored data in the cell.

A key to phase change memory technology is determining how to design large scale memory systems which allow random access of millions of bits. This has been accomplished through a system with an array of memory cells, each of which contains a programmable resistor (i.e., a phase change element) that is gated by an access transistor. The current passing through each memory cell and, more particularly, through each programmable resistor, is controlled via a matrix of word lines coupled to each access transistor gate and bit lines coupled to a terminal of each phase change element. Thus, for example, in order to write, set or reset each phase change element, a predetermined voltage is applied to the access transistor gates via the word lines, thereby allowing a current pulse to flow through the bit lines into the phase change elements (See Bedeschi et al., "4 Mb MOSFET-selected phase change memory experimental chip", ESSCIRC 2004). However, one problem associated with such a memory array configuration is that cell current and, hence, power is initially lower than intended. This lower initial power causes the initial heating rate of the memory cells to lag. Another problem is that the total energy that is deposited into each phase change element varies depending upon the location of the phase change element in the array. This location dependent energy can introduce additional fluctuations and a broader cell distribution. Therefore, there is a need in the art for an improved large scale memory system that allows random access of millions of bits through an array of memory cells, each of which contains a programmable resistor.

SUMMARY

In view of the foregoing, disclosed herein are embodiments of an improved large scale memory system and, more particularly, an improved system that allows optional bi-directional random access of millions of bits and incorporates an array of memory cells that are not subjected to location dependent power variations. Specifically, the system architecture provides a consistent amount of bit line resistance in the write and read paths to each memory cell in a memory array, independent of position, in order to minimize variations in power delivery to the cells. The system architecture can further be configured to allow current to pass in either direction through the cells in order to minimize element electromigration and, thereby, extend memory cell life.

More particularly, an embodiment of the memory system of the invention comprises a plurality of memory cells controlled via a matrix of bit lines and word lines.

Each memory cell comprises an access transistor coupled to a programmable resistor (e.g., a phase change element for a phase change random access memory). Specifically, the access transistor comprises two source/drain regions (i.e., first and second source/drain regions) and a gate. The programmable resistor comprises two terminals (i.e., first and second terminals). The second source/drain region of the access transistor is coupled to the first terminal of the programmable resistor. The first source/drain region of the access transistor and the second terminal of the programmable resistor are each coupled to different bit lines. Additionally, the gate of each access transistor in each memory cell is coupled to a word line.

The system also comprises a plurality of isolation devices (e.g., isolation transistors) that are coupled to the bit lines and are configured to establish predetermined current pathways through the bit lines and memory cells. These current pathways each comprise a first segment of one bit line coupled to the memory cell and a second segment of another bit line also coupled the memory cell. Each first segment has a corresponding first resistance and each second segment has a corresponding second resistance couple. Depending upon the memory cell location with the array, the first resistance and the second resistance may vary between the current pathways. However, the sum of the first and second resistances in each current pathway is approximately equal. Thus, the total resistance of a given current pathway that runs through a given memory cell is approximately equal to the total resistance of any other current path that runs through any other memory cell in the array, regardless of the location of the memory cell within the system.

The current passing through each memory cell and, more particularly, through each programmable resistor, is controlled via the matrix of word lines that are coupled to each access transistor gate and the different bit line segments that are coupled to the terminals of each programmable resistor. The magnitude of the memory cell heating process can be controlled by either a current source or voltage source. Thus, for example, in order to write to a programmable resistor (i.e., set or reset a phase change element), predetermined voltages are applied to both the access transistor gate and isolation transistor gate via the word line, thereby, allowing a current pulse that is generated at the source to be steered (e.g., by a decode circuit) through the targeted current pathway. Specifically, the current is directed through a pass gate, a segment of one bit line in the current pathway (i.e., a first segment), the phase change element, a segment of a different bit line in the current pathway (i.e., a second segment), the access transistor and the isolation transistor to ground.

In one embodiment of the invention, decode circuits can be coupled at one end of the current pathways and isolation transistors connected to ground can be coupled at the other end. A write driver and a sensing amplifier (i.e., write and read circuits) can be coupled to the decode circuits, thus, allowing write and read current to pass only in a single direction through the current pathways.

In another embodiment of the invention, decode circuits (i.e., first and second decode circuits) as well as isolation transistors connected to ground (i.e., first and second isolation transistor) can be coupled at both ends (i.e., both the first and second ends) of each current pathway. The first decode circuits can be adapted to direct a current in a first direction through the memory cells and the second decode circuits can be adapted to direct the current in a second direction through the memory cells. The first and second decode circuits can each be connected to first and second write drivers as well as first and second sensing amplifiers, respectively. Thus, write currents (i.e., set and reset currents) and read currents can be allowed to flow bi-directionally through the current pathways. A controller connected to the decode circuits (i.e., the first and second decode circuits) can be adapted to periodically switch the currents (i.e., the write and/or read currents) between the first direction and the second direction. For example, the controller can be adapted to switch write current directions after each cycle, after a predetermined number of cycles, after a predetermined period of time or depending upon whether a SET or RESET current is required.

Alternatively, the decode circuits at one end of the current pathways (i.e., first decode circuits) can be coupled to a write driver and the decode circuits at the other end of the current pathways (i.e., the second decode circuits) can be coupled to a sensing amplifier. Thus, write current would be allowed to flow in one direction through the current pathways and read current would be allowed to flow in the opposite direction through the same current pathways.

While the memory system, discussed above, has been described as a phase change random access memory that incorporates phase change elements as the programmable resistors of the memory cells, it is anticipated that the system configuration may be used for other types of random access memory that incorporate other types of programmable resistors in the memory cells. For example, the embodiment that provides for bi-directional write currents to pass through the memory cells may comprise a magnetic random access memory with spins valves or the like as the programmable resistors in each memory cells.

Also disclosed is an embodiment of an associated method of operating a random access memory system. The method comprises providing a memory array, as described above, comprising a plurality of memory cells controlled by a matrix of word lines and bit lines, wherein each memory cell is coupled to a word line and two of bit line. Current pathways are established through the bit lines and memory cells, using isolation transistors, so that the total resistance of each of the current pathways is approximately equal regardless of the location of the memory cell within the memory. A write current (i.e., a set or reset current) is directed through the current pathways and since the resistance in each of the current pathways is approximately equal, the total energy that is deposited in each of the memory cells is also approximately equal, regardless of the location of memory cell within the array.

Depending upon the configuration of the memory system (e.g., depending upon the placement of decode circuits, write drivers and sensing amps and upon the programming of the controller), the current can be directed in different directions (i.e., in a first direction and a second direction) through the current pathways in order to extend a lifetime of the memory cells. For example, the controller can be programmed so that the direction of current flow is switched after each write cycle, after a predetermined number of write cycles, or after a predetermined period of time. Additionally, the controller can be programmed to switch write current directions depending upon the type of write current (i.e., set or reset). Specifically, the maximum attainable power may be different in different directions, due to the amount of gate to source overdrive in the access transistors. Thus, for example, if the maximum obtainable power is greater if current flows in a first direction rather than a second direction through the current pathways, then the controller can be programmed so that reset currents are directed in the first direction and set currents are directed in the second direction because more power is required to reset a phase change material than to set a phase change material.

These and other aspects of the embodiments of the invention will be better appreciated and understood when considered in conjunction with the following description and the accompanying drawings. It should be understood, however, that the following descriptions, while indicating preferred embodiments of the invention and numerous specific details thereof, are given by way of illustration and not of limitation. Many changes and modifications may be made within the scope of the embodiments of the invention without departing from the spirit thereof, and the embodiments of the invention include all such modifications.

BRIEF DESCRIPTION OF THE DRAWINGS

The embodiments of the invention will be better understood from the following detailed description with reference to the drawings, in which.

DETAILED DESCRIPTION THE EMBODIMENTS OF THE INVENTION

Figure 1:
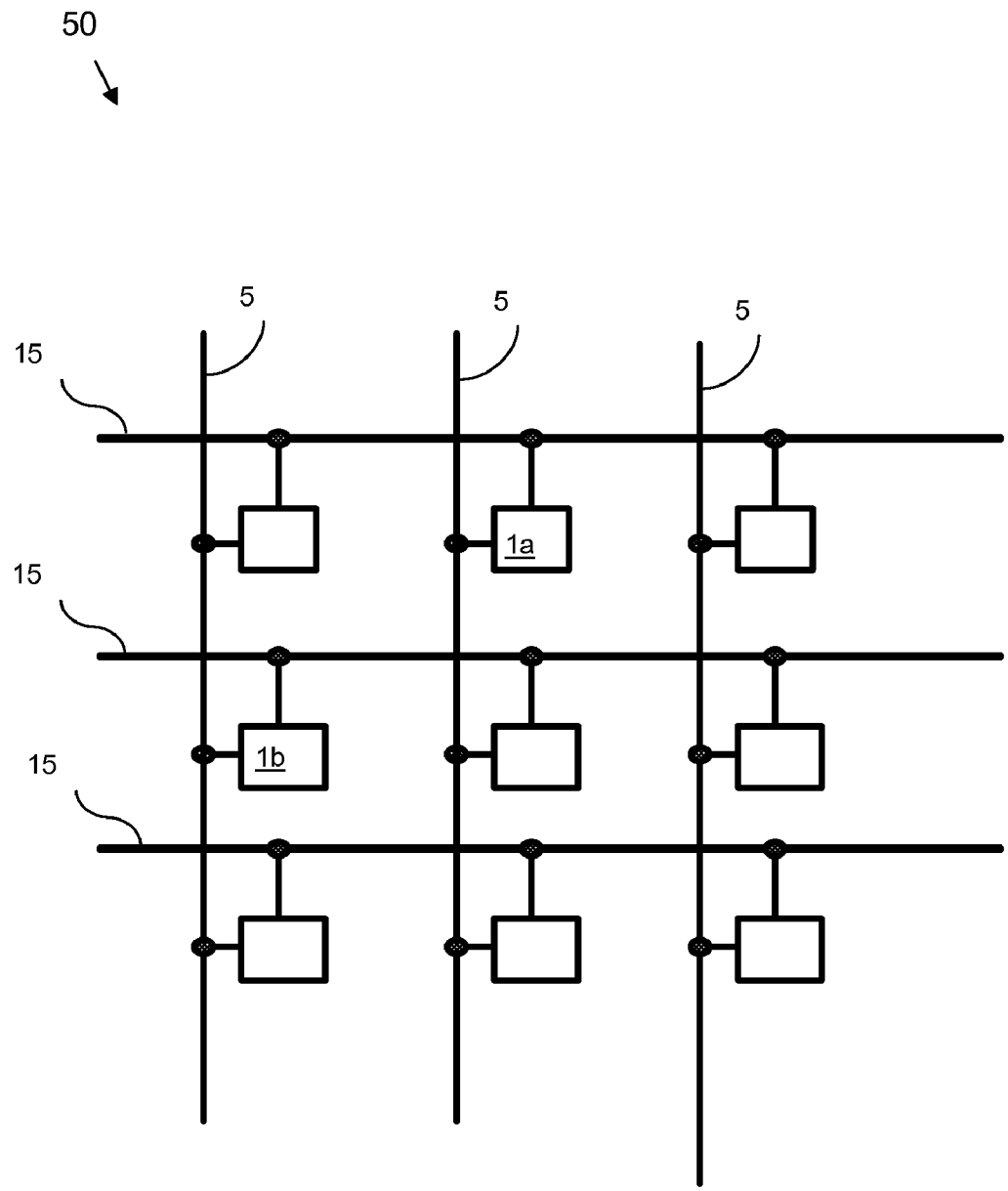
FIG. 1 is a schematic diagram illustrating a memory array.

The embodiments of the invention and the various features and advantageous details thereof are explained more fully with reference to the non-limiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the embodiments of the invention. The examples used herein are intended merely to facilitate an understanding of ways in which the embodiments of the invention may be practiced and to further enable those of skill in the art to practice the embodiments of the invention. Accordingly, the examples should not be construed as limiting the scope of the embodiments of the invention.

As mentioned above, the state of a phase change material can be switched through a heating and cooling process which is controlled electrically by passing current through the phase change element and the ohmic heating that occurs. To transform the cell from a high resistance amorphous state to a lower resistance state (i.e., to SET the material), a current pulse is sent through the programmable resistor, heating the phase change material above a predetermined temperature (i.e., above its crystallization temperature) for a given period of time to completely or partially crystallize the material. To transform the cell from a semi-amorphous/semi-crystalline or completely crystalline state to a completely amorphous state (i.e., to RESET the material), a high current pulse is applied to the cell, causing the phase change material to melt. During a subsequent quench cooling, the phase change material is amorphized.

The following U.S. patents and U.S. patent applications (incorporated herein by reference) discuss phase-change materials and methods for switching the resistances of such materials: U.S. Pat. No. 6,673,691 issued to Zhuang et al. on Jan. 6, 2004; U.S. Pat. No. 6,204,139 issued to Liu et al. on Mar. 20, 2001; and, U.S. Patent Application Pub. No. US 2004/0252544, Lowery et al., Dec. 16, 2004. Also see the following articles: Lai et al., "OUM-a 180 nm non-volatile memory cell element technology for stand alone and embedded applications", IEDM 2001; Ha et al., "An edge contact type cell for phase change RAM featuring very low power consumption", VLSI, 2003; and Horii et al., "A novel cell technology using N-doped GeSbTe films for phase change RAM", VLSI, 2003.

Recently, the availability of such phase change materials as well as progress in lithographic and deposition techniques have provided momentum towards the realization of practical phase change memory (PCM) cells for memory or storage applications, for example, as illustrated in the following patent applications (incorporated herein by reference): U.S. Patent Application Pub. No. US 2004/0036065 A1, Doan et al., Feb. 26, 2004; and U.S. Patent Application Pub. No. US 2003/0219924 A1, Bez et al., Nov. 27, 2003.

Figure 2:
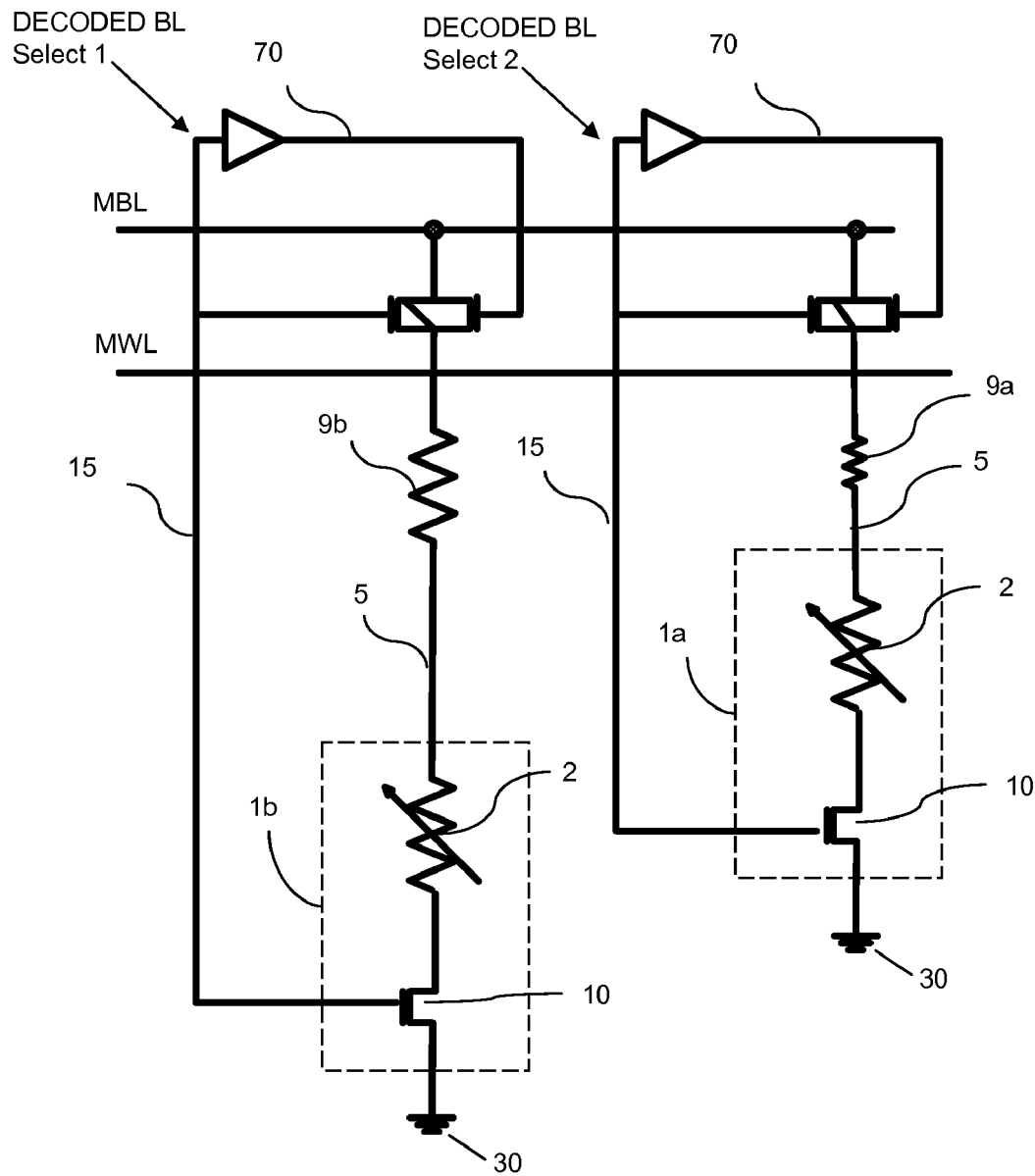
FIG. 2 is a schematic diagram illustrating an exploded view of a portion of the memory array of FIG. 1.

A key to phase change memory technology is determining how to design large scale memory systems which allow random access of millions of bits. Referring to FIGS. 1 and 2 in combination, this has been accomplished through a system with an array 50 of memory cells (e.g., see memory cells 1a-b), each of which contains a programmable resistor 2 (i.e., a phase change element) that is gated by an access transistor 10. The current passing through each memory cell 1a-b and, more particularly, through each programmable resistor 2 in each cell, is controlled via a matrix of word lines 15 coupled to each access transistor 10 gate and bit lines 5 coupled to a terminal of each phase change element 2. The magnitude of the memory cell heating process can be controlled by either a current source or voltage source. Thus, for example, in order to write (i.e., set or reset) each phase change element 2, a predetermined voltage is applied to the access transistor 10 gate via the word line 15, thereby, allowing a current pulse that is generated at the source to be steered (e.g., by decode circuit 70) through a pass gate, the bit line 5, the phase change element 2 and the access transistor 10 to ground.

One problem associated with a configuration as in memory array 50 is that cell current and, hence, power is initially lower than intended. This lower initial power is the result of parasitic capacitance of each bit line which causes the initial heating rate of the memory cells to lag. Another problem is that the total energy that is deposited into each phase change element varies depending upon the location of the phase change element in the array, due to location-dependent resistance levels in each bit line. This location dependent deposited energy can introduce additional fluctuations and a broader cell distribution. That is, variations in power delivery to cells up and down the bit line may limit array size and margin. Furthermore, a perceived lifetime failure mechanism of phase change elements and other programmable resistors (e.g., spin valves in magnetic random access memories) is elemental migration (i.e., the precipitation in a given direction of one element from the programmable resistor). It is thought that this precipitation is the result of repeated application of a current in a single direction. A mitigation technique to extend the lifetime of the bit is to pass write current in opposing directions on different write cycles. Therefore, there is a need in the art for an improved large scale memory system and, more particularly, an improved system that allows optional bi-directional random access of millions of bits and incorporates an array of memory cells that are subjected to minimal location dependent power variations.

In view of the foregoing, disclosed herein are embodiments of an improved large scale memory system and, more particularly, an improved memory system that incorporates an array of memory cells that are subjected to minimal location dependent power variations and that, optionally, allows for bi-directional random access of memory cells. Specifically, the system architecture provides a consistent amount of bit line resistance (e.g., eliminates up to 99% of variations in bit line resistance) in the write and read paths to each memory cell in the array, independent of position, in order to minimize variations in power delivery to the cells and, thereby, allow for optimal cell distributions. An optimized write control system will deliver a prescribed total power over a given period of time independent of array location and process variations. The system architecture further allows current to pass in either direction through the cells in order to minimize element electro-migration and, thereby, extend memory cell life.

Figure 3:
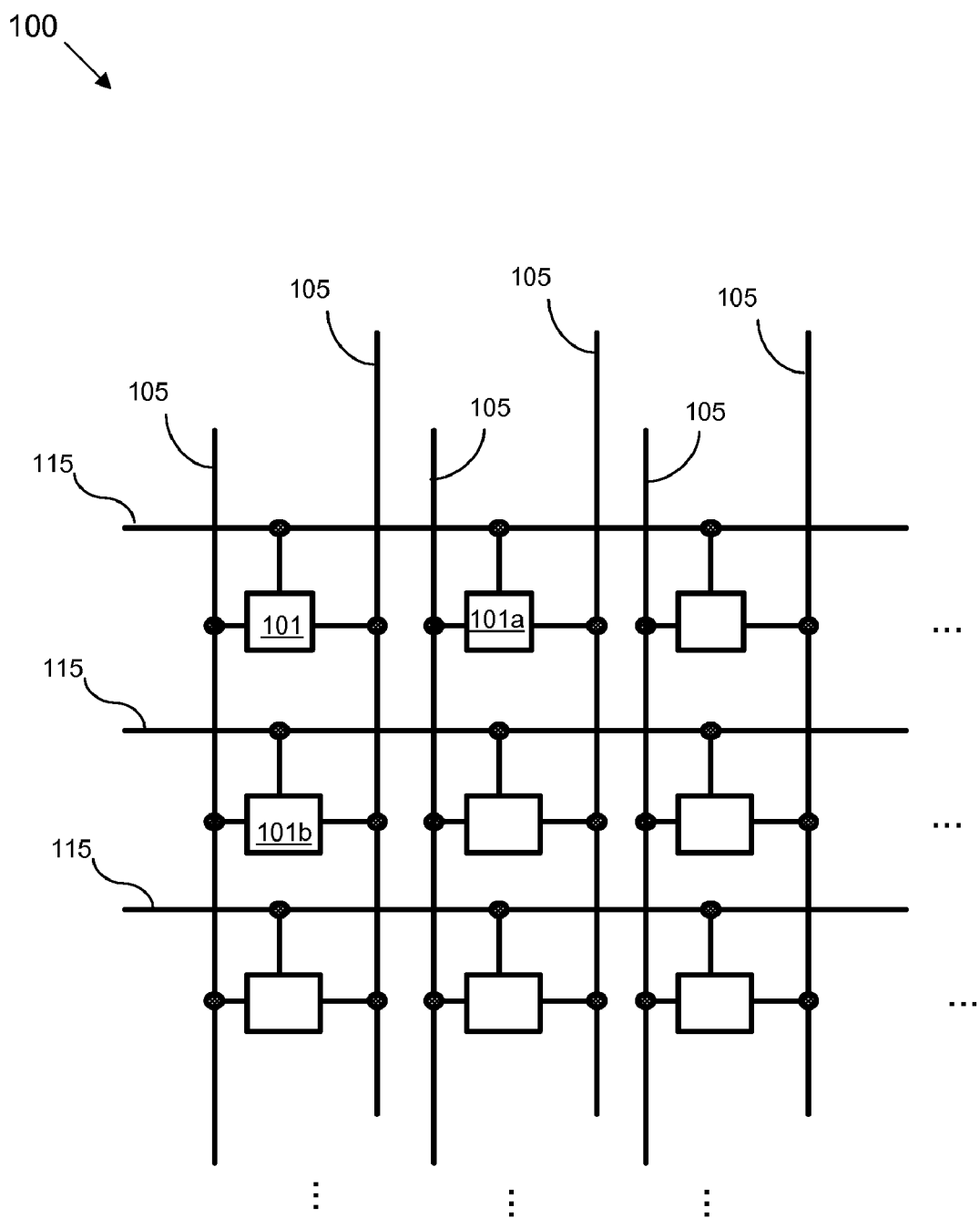
FIG. 3 is a schematic diagram illustrating an embodiment of a memory array of the invention.
Figure 4:
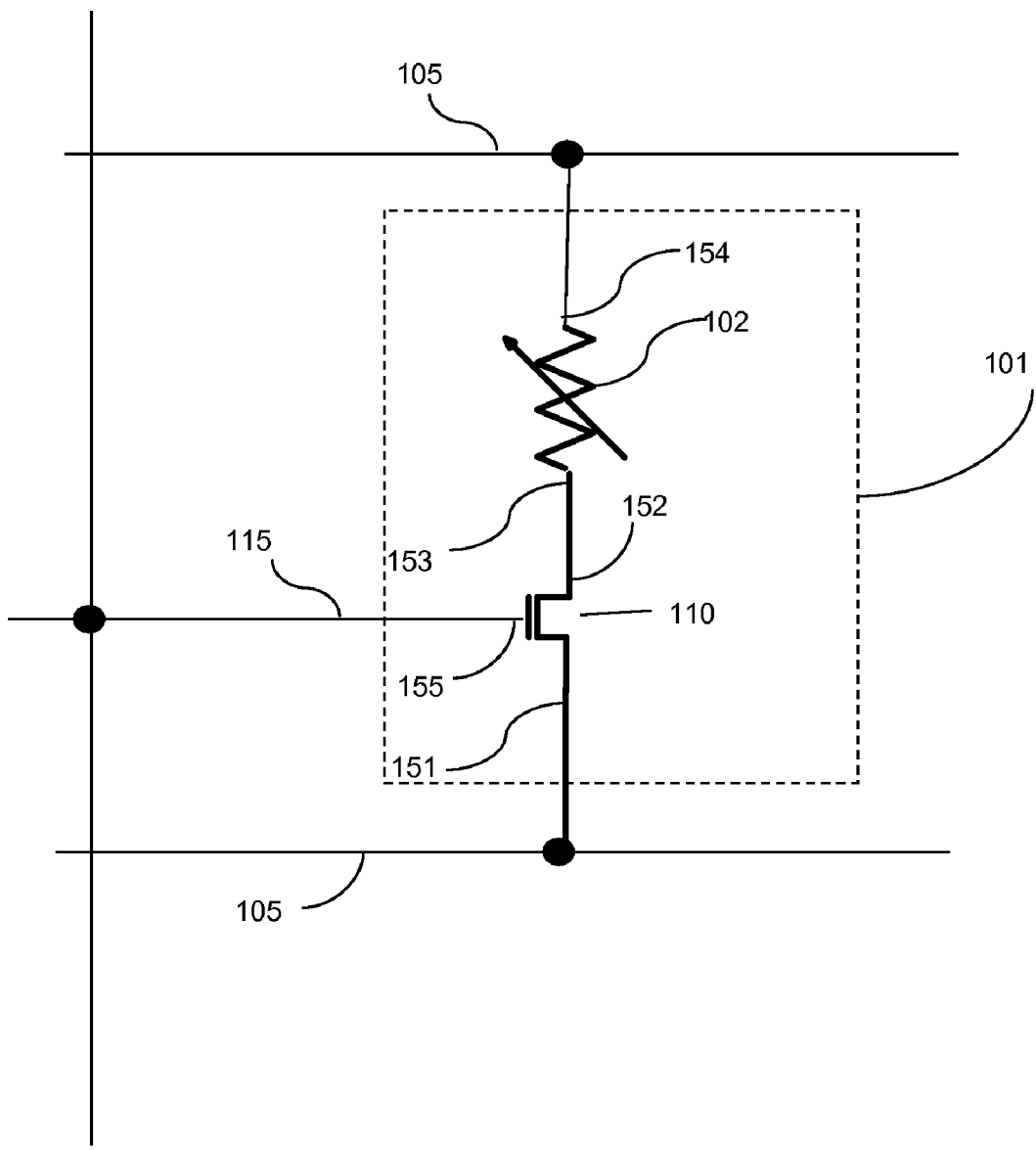
FIG. 4 is a schematic diagram illustrating an exploded view of exemplary single memory cell with the memory array of FIG. 3.

More particularly, FIG. 3 is a schematic diagram illustrating a memory array 100 in and FIG. 4 is a schematic diagram illustrating an individual memory cell 101 within that memory array 100. Referring to FIGS. 3 and 4 in combination, an embodiment of the memory system of the invention comprises a memory array 100 comprising a plurality of memory cells 101 (e.g., see 101a and 101b) controlled via a matrix of bit lines 105 and word lines 115. The word lines can be formed, for example, of a polysilicon gate material and the bit lines can be formed, for example, of a metal interconnect material.

Each memory cell 101 comprises an access transistor 110 coupled to a programmable resistor 102. Specifically, the access transistor 110 comprises two source/drain regions (i.e., first and second source/drain regions 151, 152) and a gate 155. The programmable resistor 102 comprises two terminals (i.e., first and second terminals 153, 154). The second source/drain region 152 of the access transistor 110 is coupled to the first terminal 153 of the programmable resistor 102. The first source/drain region 151 of the access transistor 110 and the second terminal 154 of the programmable resistor 102 are each coupled to different bit lines 105. Additionally, the gate 155 of each access transistor 102 in each memory cell 101 is coupled to a word line 115.

Figure 5:
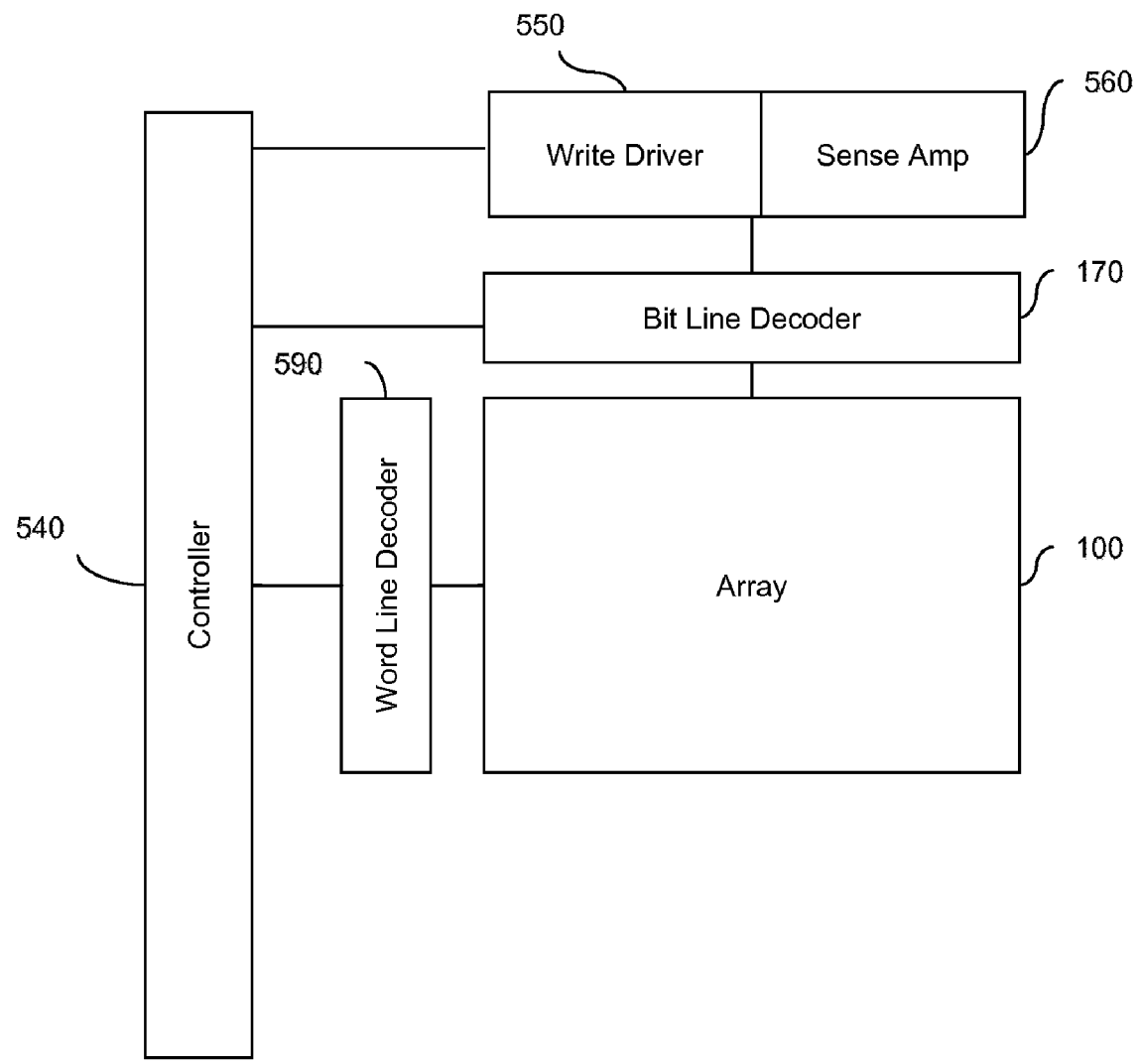
FIG. 5 is a schematic diagram illustrating an embodiment of a system of the invention incorporating the memory array of FIG. 3.
Figure 6:
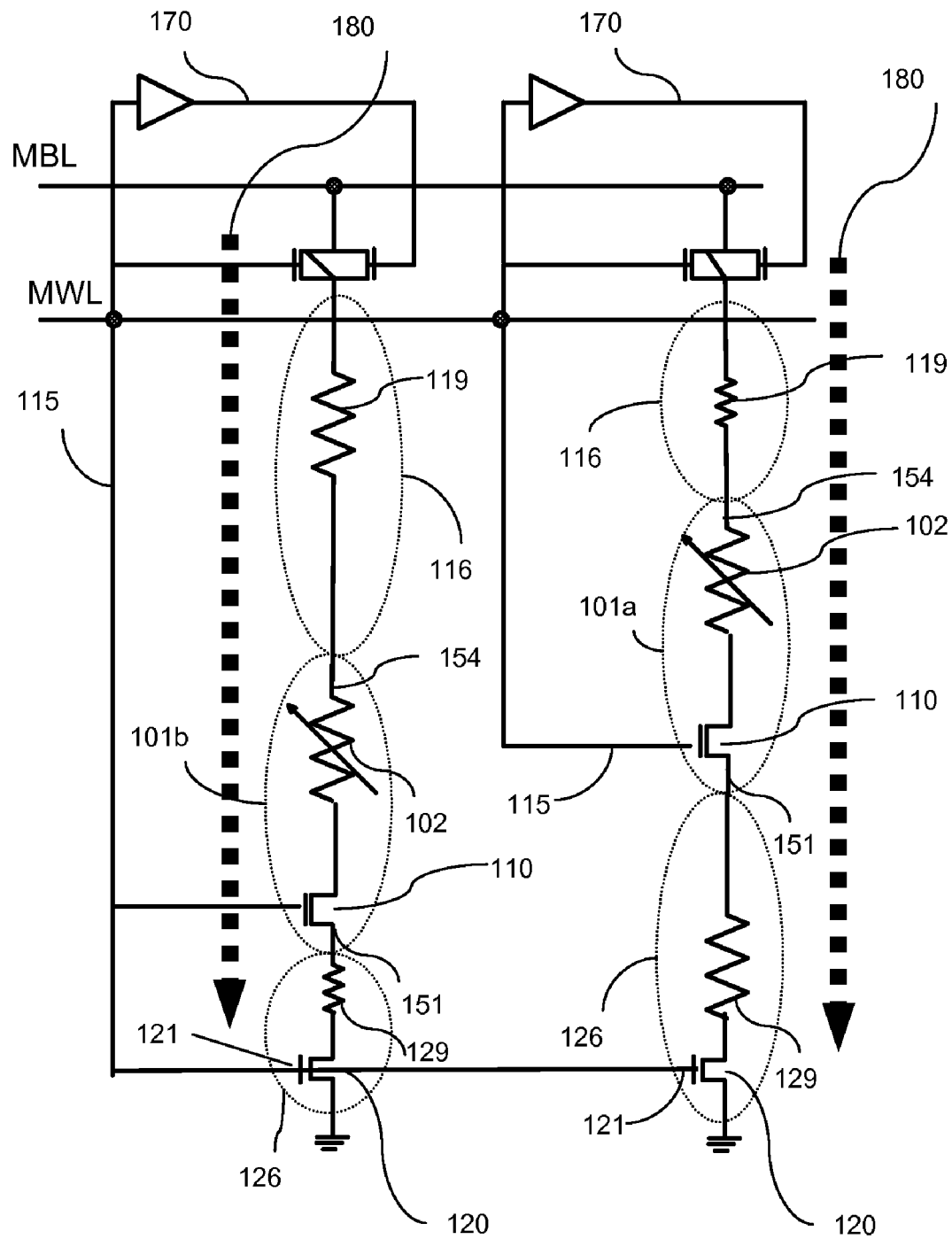
FIG. 6 is schematic diagram of an exploded view of a portion of the system of FIG. 5 illustrating single direction current pathways.
Figure 7:
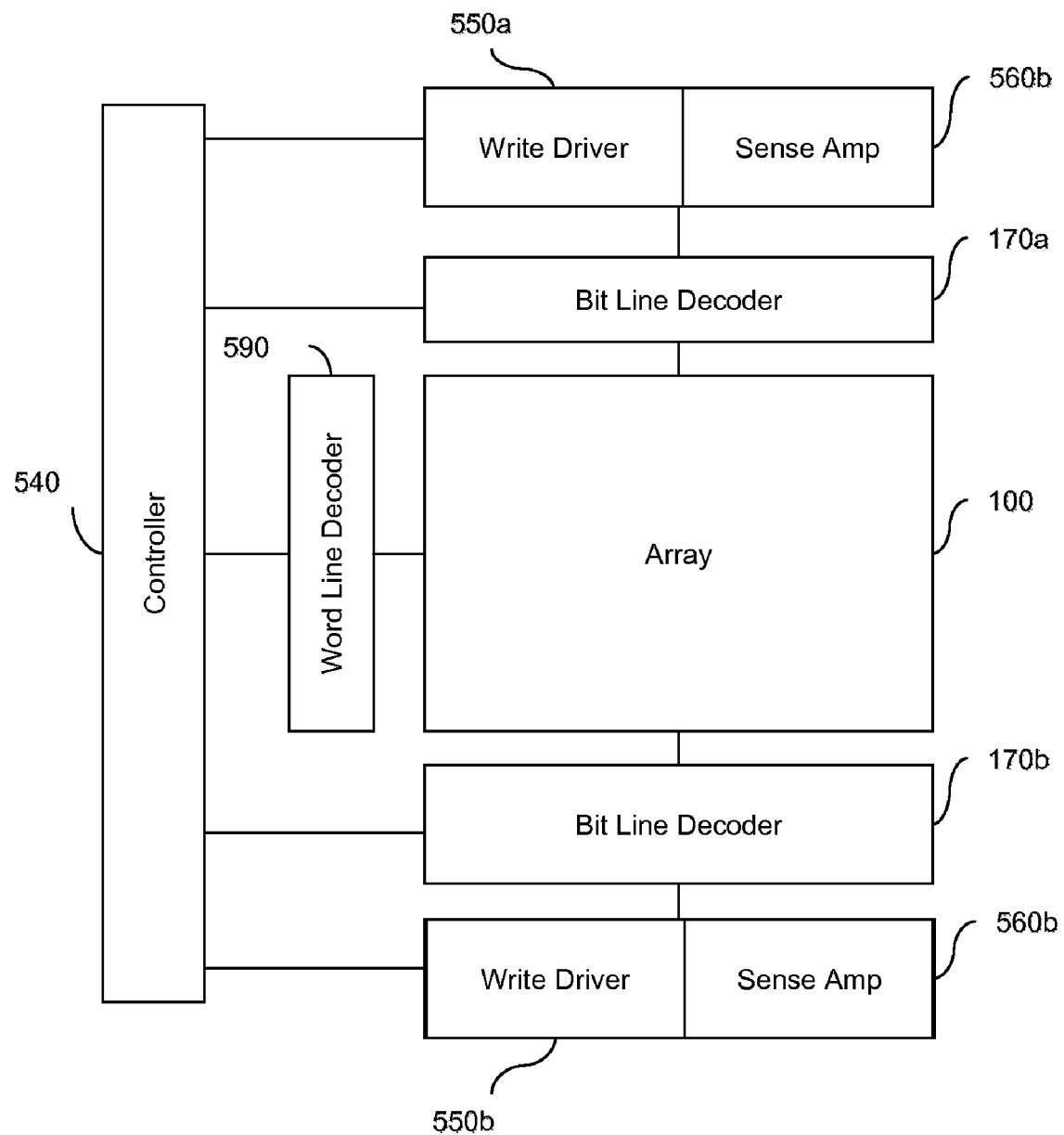
FIG. 7 is a schematic diagram illustrating another embodiment of a system of the invention incorporating the memory array of FIG. 3.
Figure 8:
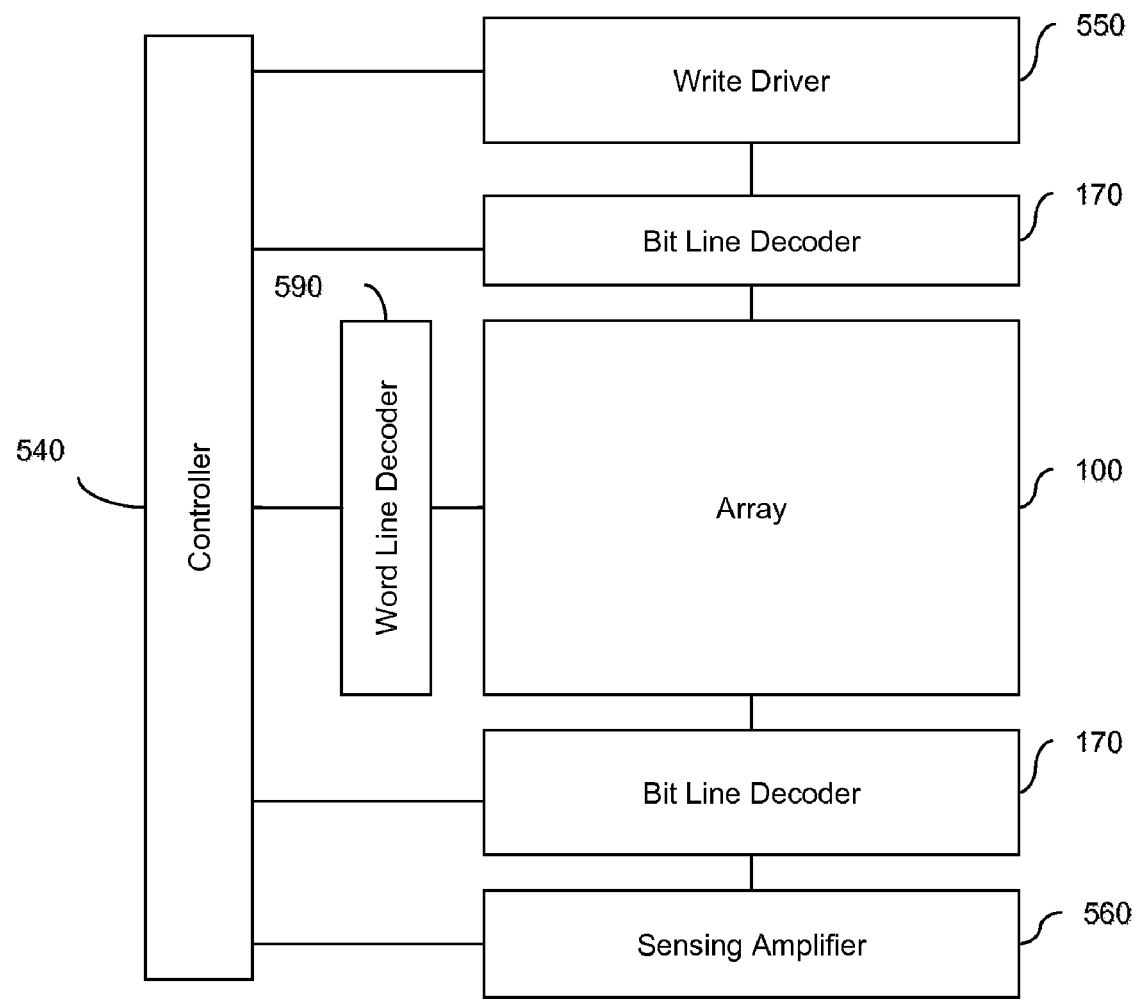
FIG. 8 is schematic diagram illustrating another embodiment of a system of the invention incorporating the memory array of FIG. 3.
Figure 9:
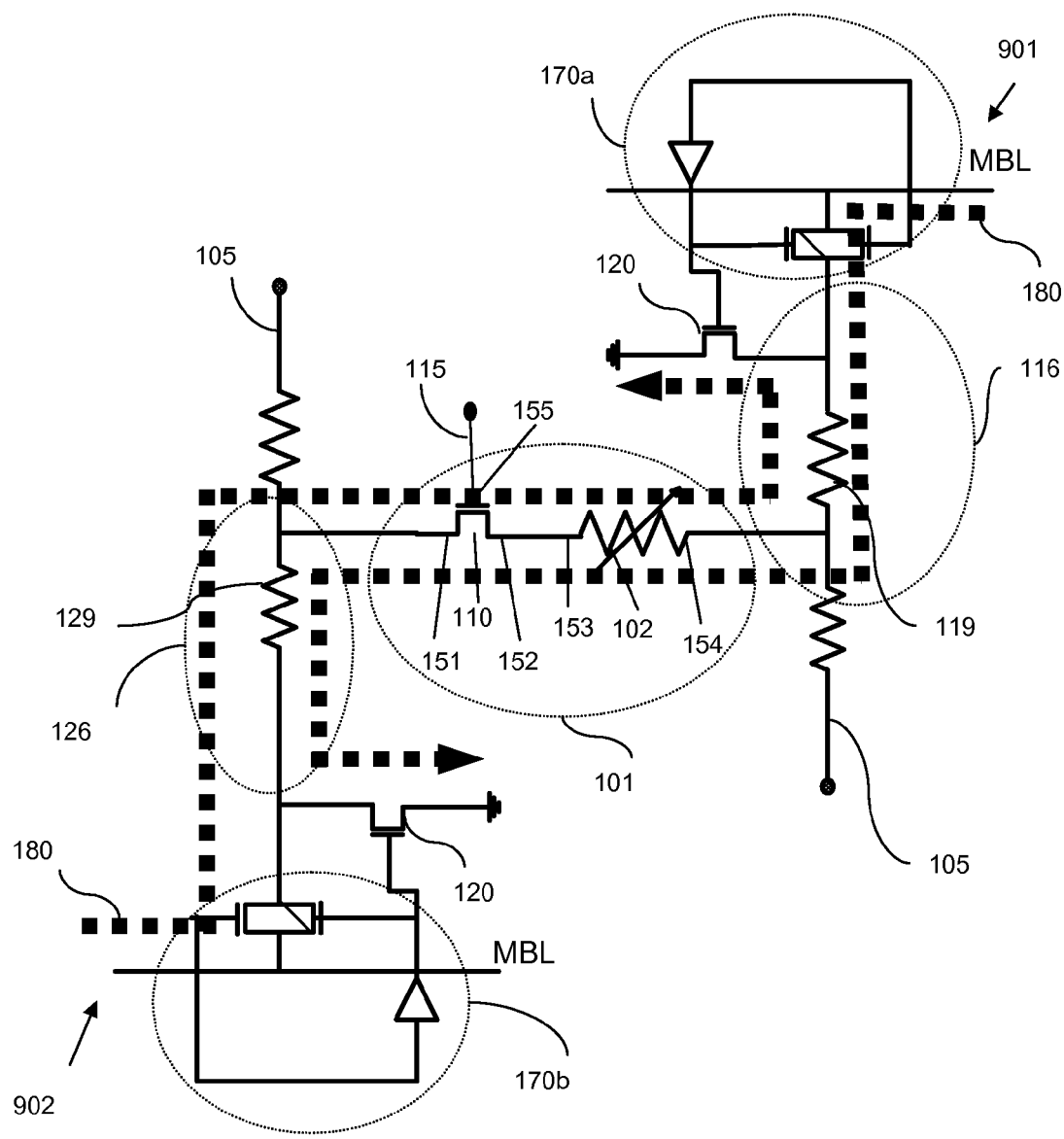
FIG. 9 is a schematic diagram of an exploded view of a portion of the system of FIG. 7 or 8 illustrating bi-directional current pathways.

FIGS. 5 is a schematic diagram illustrating an embodiment of a system of the invention incorporating the memory array 100 of FIG. 3 configured with balanced bit line resistance and also configured to allow current (e.g., read current and write (i.e., set or reset) current) to flow in only a single direction through the memory cells. FIG. 6 is a schematic diagram illustrating an exemplary single direction current pathway in the memory array 100. FIGS. 7 and 8 are schematic drawings illustrating alternative embodiments of the system of the invention incorporating the memory array of FIG. 3 configured with balanced bit line resistance, but also configured to allow current (e.g., read current and write (i.e., set or reset) current) to flow bi-directionally through the memory cells. FIG. 9 is a schematic drawing illustrating an exemplary bi-directional current pathway in the memory array 100.

Referring to both FIGS. 6 and 9, each embodiment of the system of the invention comprises a plurality of isolation devices (e.g., see isolation transistors 120). Each isolation device 120 is coupled between a bit line 105 and ground. These devices 120 can be connected to one end of each bit line 105, as illustrated in FIG. 6, and configured to establish predetermined single direction current pathways through the bit lines 105 and memory cells 101 within the array 100. Alternatively, these devices 120 can be connected at both ends of each bit line 105, as illustrated in FIG. 9, and configured to establish predetermined bi-directional current pathways 180 through the bit lines 105 and memory cells 101 within the array 100.

Each current pathway 180 comprises a first segment 116 of one bit line 105 coupled to the second terminal 154 of a programmable resistor 102 of a given memory cell 101 and a second segment 126 of another bit line 105 coupled to the first source/drain region 151 of the access transistor 110 of the same memory cell 101. Each first segment 116 has a corresponding first resistance 119 (e.g., RBL*(1-X)) and each second segment 126 has a corresponding second resistance 129 (e.g., RBL*X). Depending upon the memory cell location within the array 100, the first resistance 119 and the second resistance 129 may vary between the current pathways 180. However, the sum of the first and second resistances 119, 129 in each current pathway 180 is approximately equal. Thus, the total bit line resistance of a given current pathway, whether single or bi-directional, that runs through a given memory cell and is seen by a driver or sense amplifier is approximately equal to the total resistance of any other current pathway that runs through any other memory cell in the array, regardless of the location of the memory cell within the system (i.e., regardless of the bit accessed is nearest the source or farthest from the source).

The current passing through each memory cell 101 and, more particularly, through each programmable resistor 102, is controlled via the matrix of word lines 115 that are coupled to each access transistor gate 155 and the different bit line segments 116, 126 that are coupled to the first source/drain region 151 of the access transistor and to the second terminal 154 of the programmable resistor 102, respectively. The magnitude of the memory cell heating process can be controlled by either a current source or voltage source. Thus, for example, in order to write (i.e., set or reset a phase change element), predetermined voltages are applied to both the access transistor gate 155 and isolation transistor gate 121 via the word line 115, thereby, creating a current pathway and allowing a current pulse that is generated at the source to be steered (e.g., by a decode circuit 170) through this current pathway 180. Specifically, when the access and isolation transistors are activated by the word line, current is directed through the pathway 180 comprising a pass gate, a segment of one bit line in the current pathway (i.e., a first segment 116), the phase change element 102, a segment of a different bit line in the current pathway (i.e., a second segment 126), the access transistor 110 and the isolation transistor 120 to ground.

As mentioned above, electrical impulses applied to programmable resistors 102 in the memory cells 101 (e.g., phase change elements in phase change memory cells) can "tune" or "program" them such that they exhibit a desired resistive property and, thereby, write data to the cells. For example, programmable resistors 102 can be programmed to store one binary state (e.g., "0") at a low resistance state and another binary state (e.g., "1") at a high resistance state. Alternatively, a phase change element that is used as a programmable resistor 102 can be programmed to multiple different resistance states (e.g., a high resistance completely amorphous state, multiple mid-resistance semi-amorphous/semi-crystalline states, and a low resistance completely crystalline state) in order to store more than just a single bit (0,1) of information. The state of the phase change element can be switched through a heating and cooling process which is controlled electrically by passing current through the phase change element and the ohmic heating that occurs. To transform the cell from a high resistance amorphous state to a lower resistance state (i.e., to SET the material), a current pulse is sent through the programmable resistor, heating the phase change material above a predetermined temperature (i.e., above its crystallization temperature) for a given period of time to completely or partially crystallize the material. To transform the cell from a semi-amorphous/semi-crystalline or completely crystalline state to a completely amorphous state (i.e., to RESET the material), a high current pulse is applied to the cell, causing the phase change material to melt. During a subsequent quench cooling, the phase change material is amorphized.

Data that is written to the programmable resistor 102 can be read without destructing the resistance state of the phase change material. Specifically, a predetermined voltage that is less than the voltage required to achieve the crystallization temperature can be applied to a memory cell and the magnitude of the readout current through the cell can be detected and analyzed (e.g., using a sensing amplifier) to determine the resistance state of the cell and, thereby, the binary state of the stored data in the cell.

Referring to FIGS. 5 and 6 in combination, this embodiment of the memory system of the invention can further comprise word line decode circuits 590 coupled to one end of the word lines 115 and bit line decode circuits 170 coupled to one end of the bit lines 105. Specifically, the bit line decode circuits 170 can be coupled to one end of the single direction current pathways 180 opposite the isolation devices 120. The system can further comprise a write driver 550 and a sensing amplifier 560 (i.e., write and read circuits) coupled to the bit line decode circuits 170, thereby, allowing write current (i.e., set and reset current) and read current to pass only in a single direction through the current pathways. The system can further comprise a controller 540 that coupled to the various components of the system (e.g., the write driver, sensing amplifier, bit line decode circuits and word line decode circuit) and adapted to control those components.

Referring to FIGS. 7, 8 and 9 in combination, these embodiments of the memory system of the invention can similarly comprise word line decode circuits 590 coupled to one end of the word lines 115. However, instead of bit line decode circuits 170 coupled only to one end of the bit lines 105, first bit line decode circuits 170a can be coupled at a first end 901 of the bit lines 105 and second bit line decode circuits 170b can be coupled at a second end 902 of each of the bit lines 105. Isolation transistors 120 connected to ground (i.e., first and second isolation transistor) can similarly be coupled at both ends 901, 902 of each bit line 105. The first decode circuits 170 at the first end 901 of the bit lines 105 can be adapted to direct a current in a first direction through the memory cells 101 and the second decode circuits 170 at the second end 902 of the bit lines 105 can be adapted to direct the current in a second direction through the memory cells 101.

Specifically, referring to FIG. 7, while it may be ideal to use the same write driver all the time, due to matching, it is possible that a bi-directional write current may help the endurance of the bit and possibly even improve the distributions of the resistances and breakdown voltage. Therefore, the decode circuits 170a, 170b at either end of the array 100 can be connected to separate write drivers 550a-b and separate sensing amplifiers 560a-b, respectively. That is, the first and second decode circuits 170a-b can each be connected to first and second write drivers 550a-b as well as first and second sensing amplifiers 560a-b, respectively. Thus, write currents (i.e., set and reset currents) and read currents can be allowed to flow bi-directionally through the current pathways 180. As with the previously described embodiment, the system can further comprises a controller 540 adapted to control the functions of the various system components (e.g., the write drivers, sensing amplifiers, bit line decode circuits and word line decode circuits). Specifically, the controller 540 can be connected to the decode circuits 170a-b (i.e., the first and second decode circuits) and can be adapted to periodically switch the current (i.e., write or read currents) between the first direction and the second direction. For example, the controller 540 can be adapted to switch write current directions (e.g., by toggling a latch) after each write cycle, after a predetermined number of write cycles or after a predetermined period of time. The controller 540 can further be adapted to switch write current directions depending upon whether a set or reset current is required (e.g., by toggling one of two independent latches tracking set and reset, separately).

Alternatively, referring to FIG. 8, the decode circuits at one end 901 of the current pathways (i.e., first decode circuits 170a) can be coupled to a single write driver 550 and the decode circuits at the other end 902 of the current pathways (i.e., the second decode circuits 170b) can be coupled to a single sensing amplifier 560. Thus, write current would only be allowed to flow in one direction through the current pathways 180 and read current would only be allowed to flow in the opposite direction through the same current pathways 180.

While the memory system, discussed above, has been described as a phase change random access memory that incorporates phase change elements as the programmable resistors of the memory cells, it is anticipated that the system configuration may be used for other types of random access memory that incorporate other types of programmable resistors in the memory cells. For example, the embodiment that provides for bi-directional write currents to pass through the memory cells may comprise a magnetic random access memory with spins valves or the like as the programmable resistors in each memory cells.

Additional advantages and features of the system embodiments, described above and illustrated in FIGS. 3-9, include the fact that the systems may be implemented with only one level of metal, that oversized devices may be incorporated at one end of the array to compensate for mismatch of power delivery based upon the current direction, and that the minimum obtainable cell size can be improved by suing a wiggled bit line.

Figure 10:
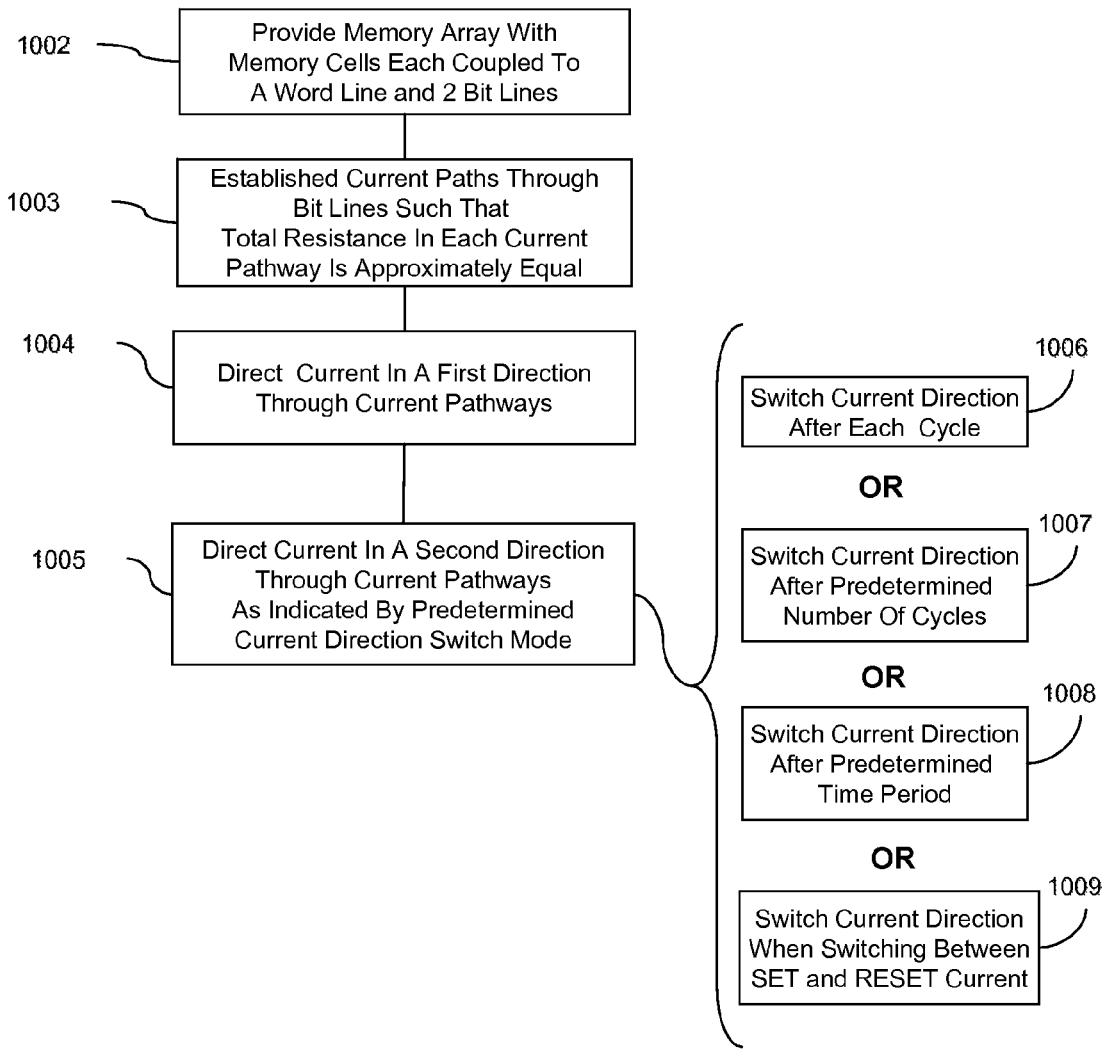
FIG. 10 is a flow diagram illustrating an embodiment of the method of the invention.

Referring to FIG. 10, also disclosed is an embodiment of an associated method of operating a random access memory system. The method comprises providing a memory array, as described above, comprising a plurality of memory cells controlled by a matrix of word lines and bit lines, wherein each memory cell is coupled to a word line and two of bit line (1002). Current pathways are established through the bit lines and memory cells, using isolation transistors, so that the total resistance of each of the current pathways is approximately equal regardless of the location of the memory cell within the memory (1003). A write current (i.e., a set or reset current) is directed through the current pathways (1004) and since the resistance in each of the current pathways is approximately equal, the total energy that is deposited in each of the memory cells is also approximately equal, regardless of the location of memory cell within the array.

Depending upon the configuration of the memory system (e.g., depending upon the placement of decode circuits, write drivers and sensing amps and upon the programming of the controller), the current can be directed in different directions through the current pathways in order to extend a lifetime of the memory cells. That is, the current can be directed in a first direction through the current pathways (1004), as discussed above. Then, the direction of the current can be switched, as indicated by a predetermined current direction switch mode, so that it flows in a second opposite direction through the same current pathways (1005). For example, the controller can be programmed with a specific current direction switch mode so that the direction of current flow is switched after each write cycle (1006), after a predetermined number of write cycles (1007), or after a predetermined period of time (1008). Alternatively, the controller can be programmed to switch write current directions depending upon the type of write current (i.e., set or reset) (1009). Specifically, the maximum attainable power may be different in different directions, due to the amount of gate to source overdrive in the access transistors. Thus, for example, if the maximum obtainable power is greater if current flows in a first direction rather than a second direction through the current pathways, then the controller can be programmed so that reset currents are directed in the first direction and set currents are directed in the second direction because more power is required to reset a phase change material than to set a phase change material.

Therefore, disclosed above are embodiments of an improved large scale memory system and, more particularly, an improved memory system that incorporates an array of memory cells that are subjected to minimal location dependent power variations and that, optionally, allows for bi-directional random access of memory cells. Specifically, the system architecture provides a consistent amount of bit line resistance in the write and read paths to each memory cell in the array, independent of position, in order to minimize variations in power delivery to the cells and, thereby, allow for optimal cell distributions. The system architecture further allows current to pass in either direction through the cells in order to minimize element electro-migration and, thereby, extend memory cell life.

The foregoing description of the specific embodiments will so fully reveal the general nature of the invention that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, those skilled in the art will recognize that the embodiments of the invention can be practiced with modification within the spirit and scope of the appended claims.

What is claimed is:

1. A memory system comprising:
   a plurality of memory cells;
   a plurality of bit lines, wherein each of said memory cells is coupled to two of said bit lines; and
   a plurality of isolation devices coupled to said bit lines and configured to establish current pathways through said bit lines and said memory cells such that a resistance of each of said current pathways is approximately equal for all memory cell locations within said system, and
   wherein said memory cells each comprise:
      an access transistor comprising:
         a first source/drain region coupled to one of said two of said bit lines; and
         a second source/drain region; and
      a programmable resistor comprising:
         a first terminal coupled to said second source/drain region; and
         a second terminal coupled to another of said two of said bit lines.

2. The memory system of claim 1, further comprising at least one decode circuit coupled to each of said bit lines.

3. The memory system of claim 1, wherein said current pathways each comprise a first segment with a first resistance and a second segment with a second resistance and wherein, depending upon said memory cell location, said first resistance and said second resistance will vary between said current pathways.

4. A memory system comprising:
   a plurality of memory cells;
   a plurality of bit lines, wherein each of said memory cells is coupled to two of said bit lines; and
   a plurality of isolation devices coupled to said bit lines and configured to establish current pathways through said bit lines and said memory cells such that a resistance of each of said current pathways is approximately equal for all memory cell locations within said system; and
   a first decode circuit connected to a first end of each of said current pathways and a second decode circuit connected to a second end of each of said current pathways, wherein said first decode circuit is adapted to direct a current in a first direction through said memory cells and wherein said second decode circuit is adapted to direct said current in a second direction, different than said first direction, through said memory cells, and
   wherein said memory cells each comprise:
      an access transistor comprising:
         a first source/drain region coupled to one of said two of said bit lines; and
         a second source/drain region; and
      a programmable resistor comprising:
         a first terminal coupled to said second source/drain region; and
         a second terminal coupled to another of said two of said bit lines.

5. The memory system of claim 4, wherein said current pathways each comprise a first segment with a first resistance and a second segment with a second resistance and wherein, depending upon said memory cell location, said first resistance and said second resistance will vary between said current pathways.

6. The memory system of claim 4, wherein said system further comprises a write driver coupled to said first decode circuit and a sensing amplifier coupled to said second decode circuit.

7. The memory system of claim 4, wherein said system further comprises a first write driver and first sensing amplifier coupled to said first decode circuit and a second write driver and a second sensing amplifier coupled to said second decode circuit.

8. The memory system of claim 4, wherein said programmable resistor comprises one of a phase change element and a spin valve.

9. A memory system comprising:
   a plurality of memory cells;
   a plurality of bit lines, wherein each of said memory cells is coupled to two of said bit line and comprises:
      an access transistor comprising:
         a first source/drain region coupled to one of said two of said bit lines; and
         a second source/drain region; and
      a programmable resistor comprising:
         a first terminal coupled to said second source/drain region; and
         a second terminal coupled to another of said two of said bit lines; and
   a plurality of isolation devices coupled to said bit lines and configured to establish current pathways through said bit lines and said memory cells such that a resistance of each of said current pathways is approximately equal for all memory cell locations within said system;
   a first decode circuit connected to a first end of each of said current pathways and a second decode circuit connected to a second end of each of said current pathways, wherein said first decode circuit is adapted to direct a write current in a first direction through said memory cells and wherein said second decode circuit is adapted to direct said write current in a second direction through said memory cells; and
   a controller connected to said first decode circuit and said second decode circuit and adapted to periodically switch said write current between said first direction and said second direction.

10. The memory system of claim 9, wherein said current pathways each comprise a first segment with a first resistance and a second segment with a second resistance and wherein, depending upon said memory cell location, said first resistance and said second resistance will vary between said current pathways.

11. The memory system of claim 9, wherein said system further comprises a write driver coupled to said first decode circuit and a sensing amplifier coupled to said second decode circuit.

12. The memory system of claim 9, wherein said system further comprises a first write driver and first sensing amplifier coupled to said first decode circuit and a second write driver and a second sensing amplifier coupled to said second decode circuit.

13. The memory system of claim 9, wherein said programmable resistor comprises one of a phase change element and a spin valve.

14. A method of operating a memory system, said method comprising:

provn a memory system comprising a memory array with a plurality of memory cells and a plurality of bit lines, wherein each one of said memory cells is coupled to two of said bit lines;

establishing current pathways through said bit lines and said memory cells such that a resistance of each of said current pathways is approximately equal for all memory cell locations within said memory array;

directing a write current through said current pathways, such that a total energy deposited in said memory cells is approximately equal for all said memory cell locations; and alternately directing said current in a first direction and a second direction through said current pathways in order to extend a lifetime of said memory cells, wherein said alternately directing comprises switching directions of said write current after one of each cycle, a predetermined number of cycles and a predetermined period of time.

15. The method of claim 14, wherein said write current comprises at least one of a set current and a reset current.

16. A method of operating a memory system, said method comprising:

providing a memory system comprising a memory array with a plurality of memory cells and a plurality of bit lines, wherein each one of said memory cells is coupled to two of said bit lines;

establishing current pathways through said bit lines and said memory cells such that a resistance of each of said current pathways is approximately equal for all memory cell locations within said memory array;

directing a write current through said current pathways, such that a total energy deposited in said memory cells is approximately equal for all said memory cell locations; and alternately directing said current in a first direction and a second direction through said current pathways in order to extend a lifetime of said memory cells, wherein if a maximum obtainable power is greater if current flows in a first direction rather than a second direction through said current pathways, then said method further comprises directing a reset current in said first direction and a set current in said second direction.

* * * * *